(12) United States Patent
Wei et al.

(10) Patent No.: US 8,435,818 B2
(45) Date of Patent: May 7, 2013

(54) METHOD FOR MAKING LIGHT EMITTING DIODE

(75) Inventors: Yang Wei, Beijing (CN); Shou-Shan Fan, Beijing (CN)

(73) Assignees: Tsinghua University, Beijing (CN); Hon Hai Precision Industry Co., Ltd., New Taipei (TW)

( * ) Notice: Subject to any disclaimer, the term of this patent is extended or adjusted under 35 U.S.C. 154(b) by 0 days.

(21) Appl. No.: 13/288,174

(22) Filed: Nov. 3, 2011

(65) Prior Publication Data

US 2012/0276670 A1    Nov. 1, 2012

(30) Foreign Application Priority Data

Apr. 29, 2011  (CN) .......................... 2011 1 0110761

(51) Int. Cl.
*H01L 22/00*   (2006.01)
*H01L 51/40*   (2006.01)

(52) U.S. Cl.
USPC .............................................. 438/42; 438/99

(58) Field of Classification Search ............ 257/46, 257/79, 90, 40, 89, 98, E33.06; 438/42, 142, 438/108, 22
See application file for complete search history.

(56) References Cited

U.S. PATENT DOCUMENTS

2010/0133569 A1*  6/2010  Li et al. ........................... 257/98
2010/0221852 A1*  9/2010  Li et al. ........................... 438/22

OTHER PUBLICATIONS

Erik T. Thostensona, Zhifeng Renb, Tsu-Wei Choua, "Advances in the science and technology of carbon nanotubes and their composites: A review", Composites Science and Technology 61 (2001) 1899-1912, Jun. 21, 2001.*
Megumi Kinoshita, Mathias Steiner, Michael Engel, Joshua P. Small, Alexander A. Green, Mark C. Hersam, Ralph Krupke, Emilio E. Mendez, and Phaedon Avouris, "The polarized carbon nanotube thin film LED", Optics Express, vol. 18, Issue 25, pp. 25738-25745 (2010), Dec. 6, 2010.*

* cited by examiner

*Primary Examiner* — Jae Lee
*Assistant Examiner* — Christina Sylvia
(74) *Attorney, Agent, or Firm* — Altis Law Group, Inc.

(57) ABSTRACT

A method of fabricating a light emitting diode includes following steps. A substrate is provided, and the substrate includes an epitaxial growth surface. A carbon nanotube layer is located on the epitaxial growth surface. A first semiconductor layer, an active layer, and a second semiconductor layer grow in that order on the substrate. An upper electrode is deposited on the second semiconductor layer. The substrate is removed. A lower electrode is deposited on the first semiconductor layer.

20 Claims, 13 Drawing Sheets

METHOD FOR MAKING LIGHT EMITTING DIODE

CROSS-REFERENCE TO RELATED APPLICATIONS

This application claims all benefits accruing under 35 U.S.C. §119 from China Patent Application 201110110761.9, filed on Apr. 29, 2011 in the China Intellectual Property Office, the disclosure of which is incorporated herein by reference. This application is related to commonly-assigned applications entitled "LIGHT EMITTING DIODE", filed on Nov. 3, 2011, Ser. No. 13/288,180; "METHOD FOR MAKING light emitting diode", filed on Nov. 3, 2011, Ser. No. 13/288,183; "LIGHT EMITTING DIODE", filed on Nov. 3, 2011, Ser. No. 13/288,187; "METHOD FOR MAKING light emitting diode", filed on Nov. 3, 2011, Ser. No. 13/288,192; "LIGHT EMITTING DIODE", filed on Nov. 3, 2011, Ser. No. 13/288,327; "LIGHT EMITTING DIODE", filed on Nov. 3, 2011, Ser. No. 13/288,203; "METHOD FOR MAKING light emitting diode", filed on Nov. 3, 2011, Ser. No. 13/288,213; "light emitting diode", filed on Nov. 3, 2011, Ser. No. 13/288,222; "METHOD FOR MAKING light emitting diode", filed on Nov. 3, 2011, Ser. No. 13/288,234; "LIGHT EMITTING DIODE", filed on Nov. 3, 2011, Ser. No. 13/288,238; "METHOD FOR MAKING light emitting diode", filed on Nov. 3, 2011, Ser. No. 13/288,246. The disclosures of the above-identified applications are incorporated herein by reference.

BACKGROUND

1. Technical Field

The present disclosure relates to a light emitting diode (LED) and a method for making the same.

2. Description of the Related Art

LEDs are semiconductors that convert electrical energy into light. Compared to conventional light sources, LEDs have higher energy conversion efficiency, higher radiance (i.e., they emit a larger quantity of light per unit area), longer lifetime, higher response speed, and better reliability. At the same time, LEDs generate less heat. Therefore, LED modules are widely used as light sources in optical imaging systems, such as displays, projectors, and so on.

A conventional method of making the LEDs method includes the following steps. A buffer layer, a first semiconductor layer, an active layer and a second semiconductor layer are deposited on a substrate by a metal organic chemical vapor deposition (MOCVD) method. The second semiconductor layer and the active layer are etched via inductance-coupling plasma etch process, thereby exposing a surface of the first semiconductor layer. A first electrode is deposited on a top surface of the first semiconductor layer via electron beam evaporation process. A second electrode is formed on the second semiconductor layer via electron beam evaporation process. In order to improve the light extraction efficiency of the LEDs, the second semiconductor is etched via inductance-coupling plasma etch process to roughen a top surface. The roughened top surface is used as the light extraction surface. However, in the above method, etching the light extraction surface to roughen the top surface thereof, is a complex manufacturing process and has a high manufacturing cost. Furthermore, during the etching process, the lattice structure of the semiconductor layer may be destroyed.

What is needed, therefore, is a light emitting diode that can overcome the above-described shortcomings.

BRIEF DESCRIPTION OF THE DRAWINGS

Many aspects of the embodiments can be better understood with reference to the following drawings. The components in the drawings are not necessarily drawn to scale, the emphasis instead being placed upon clearly illustrating the principles of the embodiments. Moreover, in the drawings, like reference numerals designate corresponding parts throughout the several views.

DETAILED DESCRIPTION

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references mean at least one.

Figure 1:
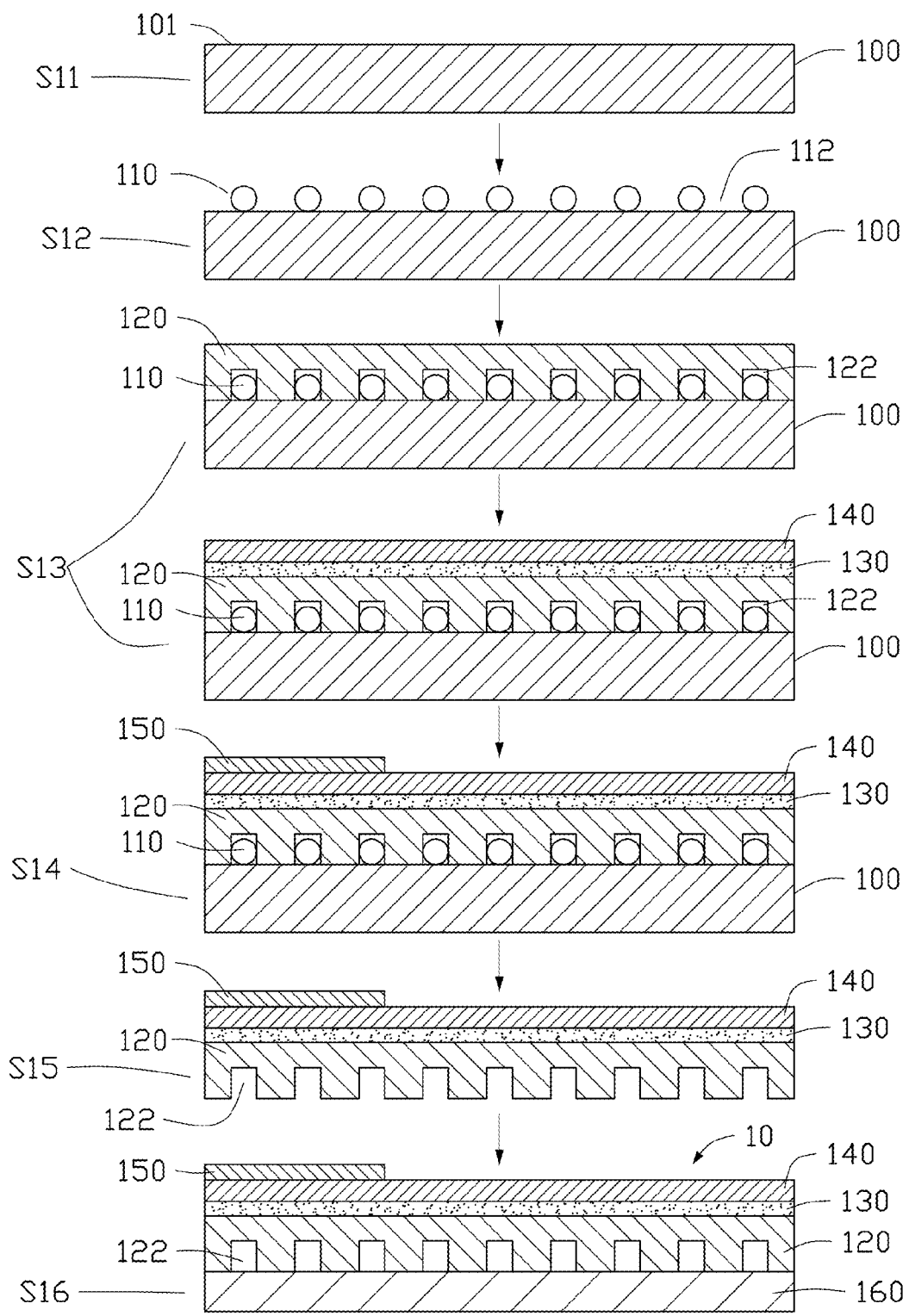
FIG. 1 is a flowchart of one embodiment a method for manufacturing a LED.

Referring to FIG. 1, a method for manufacturing a light emitting diode (LED) 10 includes the following steps:

(S11) providing a substrate 100 having an epitaxial growth surface 101;

(S12) placing a first carbon nanotube layer 110 on the epitaxial growth surface 101;

(S13) growing a first semiconductor layer 120, an active layer 130, and a second semiconductor layer 140 in that order on the epitaxial growth surface 101;

(S14) applying an upper electrode 150 on a surface of the second semiconductor layer 140;

(S15) removing the substrate 100; and (S16) applying a lower electrode 160 on a surface of the first semiconductor layer 120.

In step (S11), the substrate 100 can be made of a transparent material and adapted to support the first semiconductor layer 120. A shape or a size of the substrate 100 can be selected according to need. The epitaxial growth surface 101 can be used to grow the first semiconductor layer 120. The epitaxial growth surface 101 is a clean and smooth surface. The substrate 100 can be a single-layer structure or a multi-layer structure. If the substrate 100 is a single-layer structure, the substrate 100 can be a single-layer crystal structure having a crystal face used as the epitaxial growth surface 101. If the substrate 100 is a multi-layer structure, the substrate 100 includes at least one layer having the crystal face. The material of the substrate 100 can be GaAs, GaN, AlN, Si, SOI, SiC, MgO, ZnO, LiGaO$_2$, LiAlO$_2$, or Al$_2$O$_3$. The material of the substrate 100 can be selected according to the material of the first semiconductor layer 120. The first semiconductor layer 120 and the substrate 100 should have a small crystal lattice mismatch and a thermal expansion mismatch. The size, thickness, and shape of the substrate 100 can be selected according to need. In one embodiment, the substrate 100 is a sapphire substrate.

In step (S12), the first carbon nanotube layer 110 includes a plurality of carbon nanotubes. The carbon nanotubes in the first carbon nanotube layer 110 can be single-walled, double-walled, or multi-walled carbon nanotubes. The length and diameter of the carbon nanotubes can be selected according to need. The thickness of the first carbon nanotube layer 110 can be in a range from about 1 nm to about 100 μm, for example, about 10 nm, 100 nm, 200 nm, 1 μm, 10 μm or 50 μm. The first carbon nanotube layer 110 forms a pattern so one part of the epitaxial growth surface 101 can be exposed from the patterned first carbon nanotube layer 110 after the first carbon nanotube layer 110 is placed on the epitaxial growth surface 101. Thus, the first semiconductor layer 120 can grow from the exposed epitaxial growth surface 101.

The patterned first carbon nanotube layer 110 defines a plurality of apertures 112. The apertures 112 can be dispersed uniformly. The apertures 112 extend throughout the first carbon nanotube layer 110 along the thickness direction thereof. The aperture 112 can be a hole defined by several adjacent carbon nanotubes, or a gap defined by two substantially parallel carbon nanotubes and extending along axial direction of the carbon nanotubes. The size of the aperture 112 can be the diameter of the hole or width of the gap, and the average aperture size can be in a range from about 10 nm to about 500 μm, for example, about 50 nm, 100 nm, 500 nm, 1 μm, 10 μm, 80 μm or 120 μm. The hole-shaped apertures 112 and the gap-shaped apertures 112 can exist in the patterned first carbon nanotube layer 110 at the same time. The sizes of the apertures 112 within the same carbon nanotube layer can be different. The smaller the size of the apertures 112, the less dislocation defects will occur during the process of growing first semiconductor layer 120. In one embodiment, the sizes of the apertures 112 are in a range from about 10 nm to about 10 μm. A duty factor of the first carbon nanotube layer 110 is an area ratio between the sheltered epitaxial growth surface 101 and the exposed epitaxial growth surface 101. The duty factor of the first carbon nanotube layer 110 can be in a range from about 1:100 to about 100:1, for example, about 1:10, 1:2, 1:4, 4:1, 2:1 or 10:1. In one embodiment, the duty factor of the first carbon nanotube layer 110 is in a range from about 1:4 to about 4:1.

The carbon nanotubes of the first carbon nanotube layer 110 can be orderly arranged to form an ordered carbon nanotube structure or disorderly arranged to form a disordered carbon nanotube structure. The term 'disordered carbon nanotube structure' includes, but is not limited to, a structure where the carbon nanotubes are arranged along many different directions, and the aligning directions of the carbon nanotubes are random. The number of the carbon nanotubes arranged along each different direction can be substantially the same (e.g. uniformly disordered). The disordered carbon nanotube structure can be isotropic. The carbon nanotubes in the disordered carbon nanotube structure can be entangled with each other. The term 'ordered carbon nanotube structure' includes, but is not limited to, a structure where the carbon nanotubes are arranged in a consistently systematic manner, e.g., the carbon nanotubes are arranged approximately along a same direction and/or have two or more sections within each of which the carbon nanotubes are arranged approximately along a same direction (different sections can have different directions).

In one embodiment, the carbon nanotubes in the first carbon nanotube layer 110 are arranged to extend along the direction substantially parallel to the epitaxial growth surface 101 to obtain a better pattern and greater light transmission. After being placed on the epitaxial growth surface 101, the carbon nanotubes in the first carbon nanotube layer 110 are arranged to extend along the direction substantially parallel to the epitaxial growth surface 101. In one embodiment, all the carbon nanotubes in the first carbon nanotube layer 110 are arranged to extend along the same direction. In another embodiment, some of the carbon nanotubes in the first carbon nanotube layer 110 are arranged to extend along a first direction, and some of the carbon nanotubes in the first carbon nanotube layer 110 are arranged to extend along a second direction, perpendicular to the first direction. Also the carbon nanotubes in the ordered carbon nanotube structure can be arranged to extend along the crystal orientation of the substrate 100 or along a direction which forms an angle with the crystal orientation of the substrate 100.

The first carbon nanotube layer 110 can be formed on the epitaxial growth surface 101 by chemical vapor deposition (CVD), transfer printing a preformed carbon nanotube film, filtering and depositing a carbon nanotube suspension. In one embodiment, the first carbon nanotube layer 110 is a free-standing structure and can be drawn from a carbon nanotube array. The term "free-standing structure" means that the first carbon nanotube layer 110 can sustain the weight of itself when it is hoisted by a portion thereof without any significant damage to its structural integrity. Thus, the first carbon nanotube layer 110 can be suspended by two spaced supports. The free-standing first carbon nanotube layer 110 can be laid on the epitaxial growth surface 101 directly and easily.

The first carbon nanotube layer 110 can be a substantially pure structure of the carbon nanotubes, with few impurities and chemical functional groups. The first carbon nanotube layer 110 can be a composite including a carbon nanotube matrix and non-carbon nanotube materials. The non-carbon nanotube materials can be graphite, graphene, silicon carbide, boron nitride, silicon nitride, silicon dioxide, diamond, amorphous carbon, metal carbides, metal oxides, or metal nitrides. The non-carbon nanotube materials can be coated on the carbon nanotubes of the first carbon nanotube layer 110 or filled in the apertures 112. In one embodiment, the non-carbon nanotube materials are coated on the carbon nanotubes of the first carbon nanotube layer 110 so the carbon nanotubes can have a greater diameter and the apertures 112 can a have smaller size. The non-carbon nanotube materials can be deposited on the carbon nanotubes of the first carbon nanotube layer 110 by CVD or physical vapor deposition (PVD), such as sputtering.

Furthermore, the first carbon nanotube layer 110 can be treated with an organic solvent after being placed on the epitaxial growth surface 101 so the first carbon nanotube layer 110 can be firmly attached on the epitaxial growth surface 101. Specifically, the organic solvent can be applied to the entire surface of the first carbon nanotube layer 110 or the entire first carbon nanotube layer 110 can be immersed in an organic solvent. The organic solvent can be volatile, such as ethanol, methanol, acetone, dichloroethane, chloroform, or mixtures thereof. In one embodiment, the organic solvent is ethanol.

The first carbon nanotube layer 110 can include at least one carbon nanotube film, at least one carbon nanotube wire, or a combination thereof. In one embodiment, the first carbon nanotube layer 110 can include a single carbon nanotube film or two or more stacked carbon nanotube films. Thus, the thickness of the first carbon nanotube layer 110 can be controlled by the number of the stacked carbon nanotube films. The number of the stacked carbon nanotube films can be in a range from about 2 to about 100, for example, about 10, 30, or 50. In one embodiment, the first carbon nanotube layer 110 can include a layer of parallel and spaced carbon nanotube wires. The first carbon nanotube layer 110 can also include a plurality of carbon nanotube wires crossed or weaved together to form a carbon nanotube net. The distance between two adjacent parallel and spaced carbon nanotube wires can be in a range from about 0.1 µm to about 200 µm. In one embodiment, the distance between two adjacent parallel and spaced carbon nanotube wires can be in a range from about 10 µm to about 100 µm. The size of the apertures 112 can be controlled by controlling the distance between two adjacent parallel and spaced carbon nanotube wires. The length of the gap between two adjacent parallel carbon nanotube wires can be equal to the length of the carbon nanotube wire. It is understood that any carbon nanotube structure described can be used with all embodiments.

Figure 2:
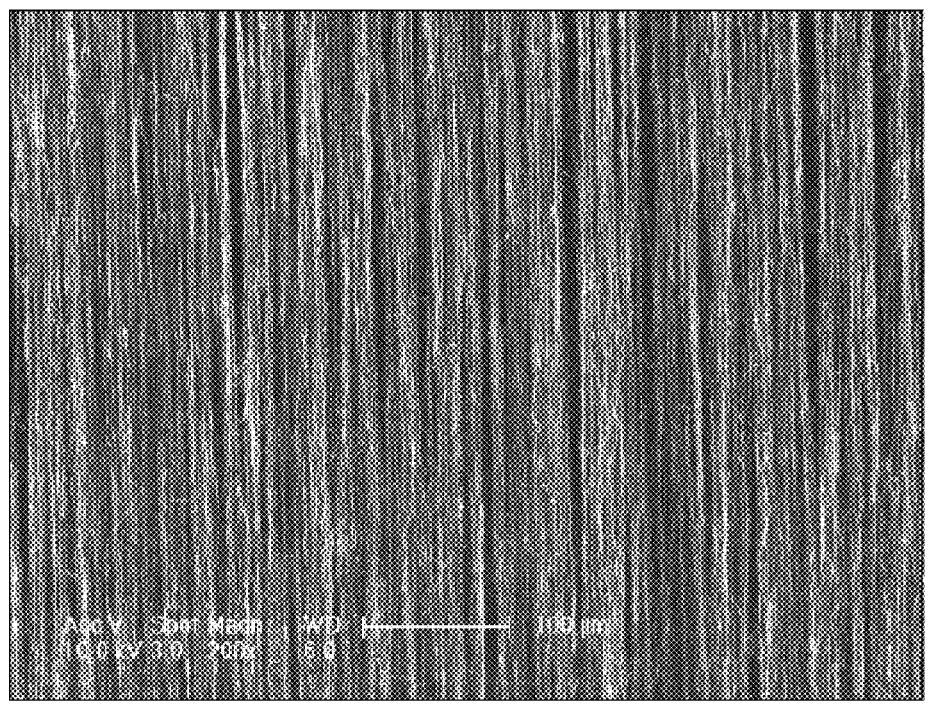
FIG. 2 shows a Scanning Electron Microscope (SEM) image of one embodiment of a drawn carbon nanotube film.
Figure 3:
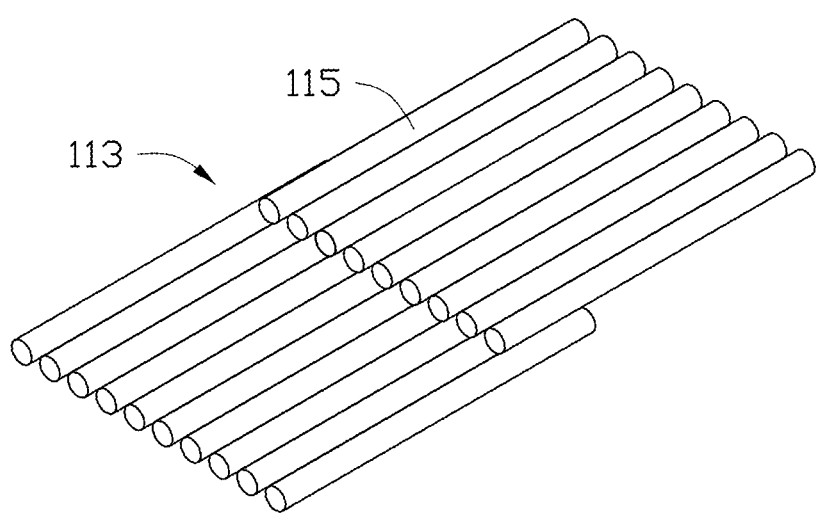
FIG. 3 shows a schematic view of one embodiment of a carbon nanotube segment of a drawn carbon nanotube film.

In one embodiment, the first carbon nanotube layer 110 includes at least one drawn carbon nanotube film. A drawn carbon nanotube film can be drawn from a carbon nanotube array that is able to have a film drawn therefrom. The drawn carbon nanotube film includes a plurality of successive and oriented carbon nanotubes joined end-to-end by van der Waals attractive force therebetween. The drawn carbon nanotube film is a free-standing film. Referring to FIGS. 2 and 3, each drawn carbon nanotube film includes a plurality of successively oriented carbon nanotube segments 113 joined end-to-end by van der Waals attractive force therebetween. Each carbon nanotube segment 113 includes a plurality of carbon nanotubes 115 parallel to each other, and combined by van der Waals attractive force therebetween. Some variations can occur in the drawn carbon nanotube film. The carbon nanotubes 115 in the drawn carbon nanotube film are oriented along a preferred orientation. The drawn carbon nanotube film can be treated with an organic solvent to increase the mechanical strength and toughness, and reduce the coefficient of friction of the drawn carbon nanotube film. A thickness of the drawn carbon nanotube film can range from about 0.5 nm to about 100 µm. The drawn carbon nanotube film can be attached to the epitaxial growth surface 101 directly.

Figure 4:
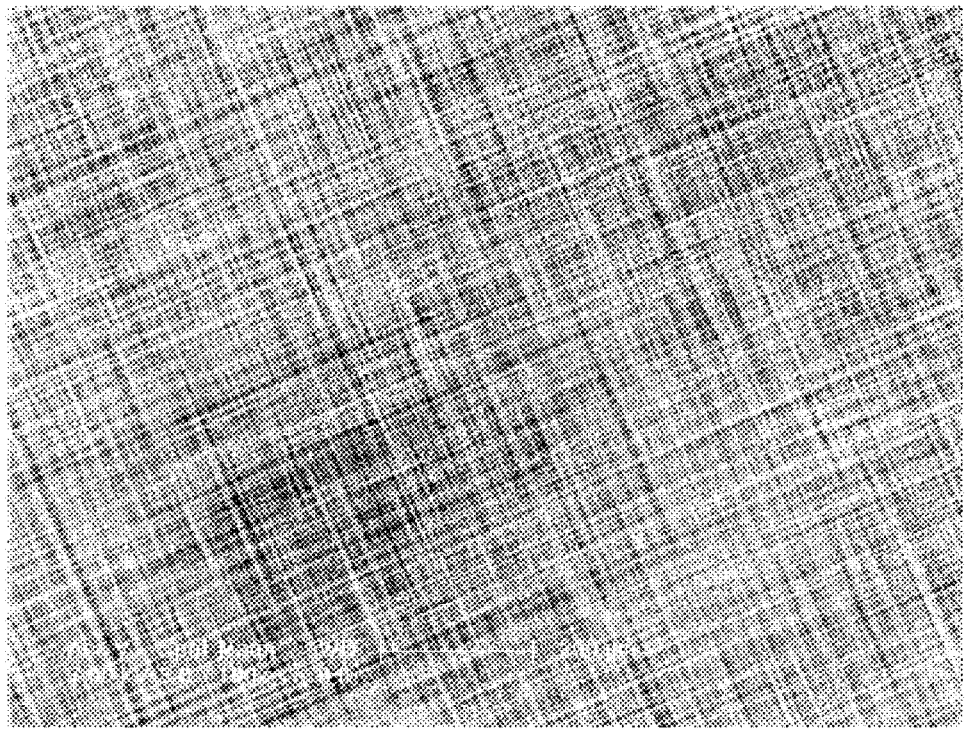
FIG. 4 shows a SEM image of one embodiment of a plurality of carbon nanotube film stacked in a cross order.

Referring to FIG. 4, the first carbon nanotube layer 110 can include at least two stacked drawn carbon nanotube films. In other embodiments, the first carbon nanotube layer 110 can include two or more coplanar carbon nanotube films, and each coplanar carbon nanotube film can include multiple layers. Additionally, if the carbon nanotubes in the carbon nanotube film are aligned along one preferred orientation (e.g., the drawn carbon nanotube film), an angle can exist between the orientation of carbon nanotubes in adjacent films, whether stacked or adjacent. Adjacent carbon nanotube films are combined by the van der Waals attractive force therebetween. An angle between the aligned directions of the carbon nanotubes in two adjacent carbon nanotube films can range from about 0 degrees to about 90 degrees. If the angle between the aligned directions of the carbon nanotubes in adjacent stacked drawn carbon nanotube films is larger than 0 degrees, a plurality of micropores is defined by the first carbon nanotube layer 110. Referring to FIG. 4, the first carbon nanotube layer 110 shown with the angle between the aligned directions of the carbon nanotubes in adjacent stacked drawn carbon nanotube films is 90 degrees. Stacking the carbon nanotube films will also add to the structural integrity of the first carbon nanotube layer 110.

Heating of the drawn carbon nanotube film can be performed to decrease the thickness of the drawn carbon nanotube film. The drawn carbon nanotube film can be partially heated by a laser or microwaves. The thickness of the drawn carbon nanotube film can be reduced because some of the carbon nanotubes will be oxidized. In one embodiment, the drawn carbon nanotube film is irradiated by a laser device in an atmosphere including oxygen therein. The power density of the laser is greater than $0.1 \times 10^4$ W/m$^2$. The drawn carbon nanotube film can be heated by fixing the drawn carbon nanotube film and moving the laser device at an even/uniform speed to irradiate the drawn carbon nanotube film. When the laser irradiates the drawn carbon nanotube film, the laser is focused on the surface of drawn carbon nanotube film to form a laser spot. The diameter of the laser spot ranges from about 1 micron to about 5 mm. In one embodiment, the laser device is carbon dioxide laser device. The power of the laser device is about 30 W. The wavelength of the laser is about 10.6 µm. The diameter of the laser spot is about 3 mm. The velocity of the laser movement is less than 10 mm/s The power density of the laser is about $0.053 \times 10^{12}$ W/m$^2$.

In another embodiment, the first carbon nanotube layer 110 can include a pressed carbon nanotube film. The pressed carbon nanotube film can be a free-standing carbon nanotube film. The carbon nanotubes in the pressed carbon nanotube film are arranged along a same direction or arranged along different directions. The carbon nanotubes in the pressed carbon nanotube film can rest upon each other. Adjacent carbon nanotubes are attracted to each other and combined by van der Waals attractive force. An angle between a primary alignment direction of the carbon nanotubes and a surface of the pressed carbon nanotube film is about 0 degrees to approximately 15 degrees. The greater the pressure is applied, the smaller the angle formed. If the carbon nanotubes in the pressed carbon nanotube film are arranged along different directions, the first carbon nanotube layer 110 can be isotropic.

In another embodiment, the first carbon nanotube layer 110 includes a flocculated carbon nanotube film. The flocculated carbon nanotube film can include a plurality of long, curved, disordered carbon nanotubes entangled with each other. Furthermore, the flocculated carbon nanotube film can be isotropic. The carbon nanotubes can be substantially uniformly dispersed in the carbon nanotube film. Adjacent carbon nanotubes are acted upon by van der Waals attractive force to form an entangled structure with micropores defined therein. It is understood that the flocculated carbon nanotube film is very porous. Sizes of the micropores can be less than 10 µm. The porous nature of the flocculated carbon nanotube film will increase the specific surface area of the first carbon nanotube layer 110. Additionally, because the carbon nanotubes in the first carbon nanotube layer 110 are entangled with each other, the first carbon nanotube layer 110 employing the flocculated carbon nanotube film has excellent durability, and can be fashioned into desired shapes with a low risk to the integrity of the first carbon nanotube layer 110. In some embodiments, the flocculated carbon nanotube film is a free-standing structure because the carbon nanotubes being entangled and adhered together by van der Waals attractive force therebetween.

Figure 5:
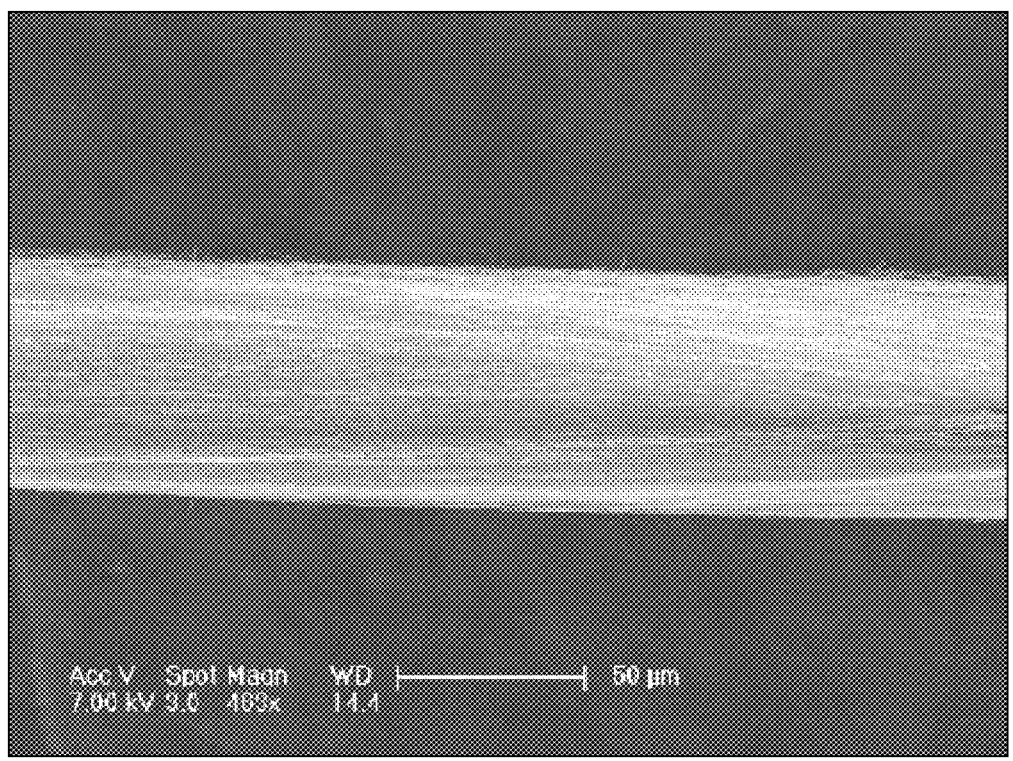
FIG. 5 shows a SEM image of one embodiment of an untwisted carbon nanotube wire.

The carbon nanotube wire can be untwisted or twisted. Treating the drawn carbon nanotube film with a volatile organic solvent can form the untwisted carbon nanotube wire. Specifically, the organic solvent is applied to soak the entire surface of the drawn carbon nanotube film. During the soaking, adjacent parallel carbon nanotubes in the drawn carbon nanotube film will bundle together, due to the surface tension of the organic solvent as it volatilizes. Thus, the drawn carbon nanotube film will be shrunk into untwisted carbon nanotube wire. Referring to FIG. 5, the untwisted carbon nanotube wire includes a plurality of carbon nanotubes substantially oriented along a same direction (i.e., a direction along the length of the untwisted carbon nanotube wire). The carbon nanotubes are parallel to the axis of the untwisted carbon nanotube wire. Specifically, the untwisted carbon nanotube wire includes a plurality of successive carbon nanotube segments joined end to end by van der Waals attractive force therebetween. Each carbon nanotube segment includes a plurality of carbon nanotubes substantially parallel to each other, and combined by van der Waals attractive force therebetween. The carbon nanotube segments can vary in width, thickness, uniformity, and shape. Length of the untwisted carbon nanotube wire can be arbitrarily set as desired. A diameter of the untwisted carbon nanotube wire ranges from about 0.5 nm to about 100 μm.

Figure 6:
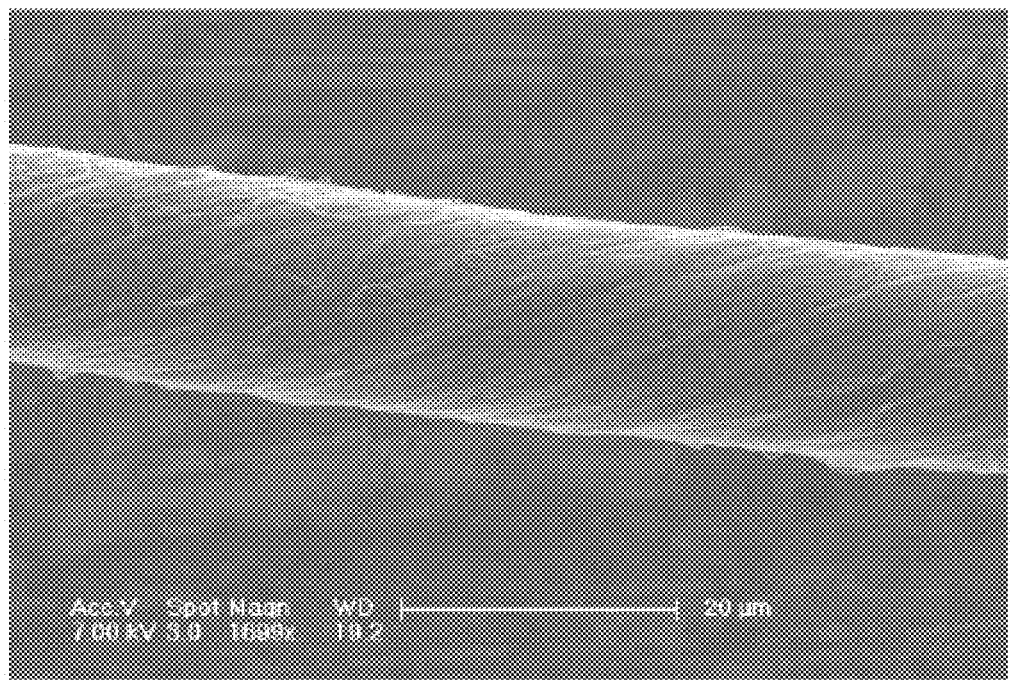
FIG. 6 shows a SEM image of one embodiment of a twisted carbon nanotube wire.

The twisted carbon nanotube wire can be formed by twisting a drawn carbon nanotube film using a mechanical force to turn the two ends of the drawn carbon nanotube film in opposite directions. Referring to FIG. 6, the twisted carbon nanotube wire includes a plurality of carbon nanotubes helically oriented around an axial direction of the twisted carbon nanotube wire. Specifically, the twisted carbon nanotube wire includes a plurality of successive carbon nanotube segments joined end to end by van der Waals attractive force therebetween. Each carbon nanotube segment includes a plurality of carbon nanotubes parallel to each other, and combined by van der Waals attractive force therebetween. Length of the carbon nanotube wire can be set as desired. A diameter of the twisted carbon nanotube wire can be from about 0.5 nm to about 100 μm. Further, the twisted carbon nanotube wire can be treated with a volatile organic solvent after being twisted. After being soaked by the organic solvent, the adjacent paralleled carbon nanotubes in the twisted carbon nanotube wire will bundle together, due to the surface tension of the organic solvent when the organic solvent volatilizes. The specific surface area of the twisted carbon nanotube wire will decrease, while the density and strength of the twisted carbon nanotube wire will be increased.

As discussed above, the first carbon nanotube layer 110 can be used as a mask for growing the first semiconductor layer 120. The term 'mask for growing the first semiconductor layer 120' means that the first carbon nanotube layer 110 can be used to shelter part of the epitaxial growth surface 101 and expose the other part of the epitaxial growth surface 101. Thus, the first semiconductor layer 120 can grow from the exposed epitaxial growth surface 101. The first carbon nanotube layer 110 can form a patterned mask on the epitaxial growth surface 101 because the first carbon nanotube layer 110 defines a plurality of apertures 112. Compare to lithography or etching, the method of forming a first carbon nanotube layer 110 as a mask is simple, low in cost, and will not pollute the substrate 100.

In step (S13), the first semiconductor layer 120, the active layer 130 and the second semiconductor layer 140 can be grown respectively via a process of molecular beam epitaxy (MBE), chemical beam epitaxy (CBE), vacuum epitaxy, low temperature epitaxy, selective epitaxy, liquid phase deposition epitaxy (LPE), metal organic vapor phase epitaxy (MOVPE), ultra-high vacuum chemical vapor deposition (UHVCVD), hydride vapor phase epitaxy (HVPE), or metal organic chemical vapor deposition (MOCVD). In one embodiment, the material of the first semiconductor layer 120, the active layer 130, and the second semiconductor layer 140 are the same semiconductor material, thus the defects caused by dislocation during the growth process will be reduced.

The first semiconductor layer 120 has a thickness of about 0.5 nm to about 5 μm, for example 10 nm, 100 nm, 1 μm, 2 μm, and 3 μm. In one embodiment, the thickness of the first semiconductor layer 120 is about 2 μm. The first semiconductor layer 120 is N-type semiconductor or P-type semiconductor. The material of N-type semiconductor can include N-type gallium nitride, N-type gallium arsenide, or N-type copper phosphate. The material of P-type semiconductor can include P-type gallium nitride, P-type gallium arsenide, or P-type copper phosphate. The N-type semiconductor is configured to provide electrons, and the P-type semiconductor is configured to provide holes. In one embodiment, the first semiconductor layer 120 is an N-type gallium nitride doped with Si.

In one embodiment, the first semiconductor layer 120 is made by MOCVD, and the growth of the first semiconductor layer 120 is heteroepitaxial growth. In the MOCVD, the nitrogen source gas is high-purity ammonia ($NH_3$), the carrier gas is hydrogen ($H_2$), the Ga source gas can be trimethyl gallium (TMGa) or triethyl gallium (TEGa), and the Si source gas is silane ($SiH_4$). The growth of the first semiconductor layer 120 includes the following steps:

(S131) placing the substrate 100 with the first carbon nanotube layer 110 thereon into a reaction chamber, heating the substrate 100 to about 1100° C. to about 1200° C., introducing the carrier gas, and baking the substrate 100 for about 200 seconds to about 1000 seconds;

(S132) growing the low-temperature GaN layer by reducing the temperature to a range from about 500° C. to 650° C. in the carrier gas atmosphere, and introducing the Ga source gas and the nitrogen source gas at the same time;

(S133) stopping the flow of the Ga source gas in the carrier gas and nitrogen source gas atmosphere, increasing the temperature to a range from about 1100° C. to about 1200° C., and maintaining the temperature for about 30 seconds to about 300 seconds;

(S134) growing the high quality first semiconductor layer 120 by maintaining the temperature of the substrate 100 in a range from about 1000° C. to about 1100° C., and reintroducing the Ga source gas and the Si source gas.

In step (S132), the low-temperature GaN is used as a buffer layer (not shown) to grow the first semiconductor layer 120. The thickness of the buffer layer is less than the thickness of the first carbon nanotube layer 110. Because the first semiconductor layer 120 and the substrate 100 have different lattice constants, the buffer layer is used to reduce the lattice mismatch during the growth process, thus the dislocation density of the first semiconductor layer 120 will be reduced.

In step (S134), the growth of the first semiconductor layer 120 includes three stages. In the first stage, a plurality of epitaxial crystal nucleus forms on the epitaxial growth surface 101, and the epitaxial crystal nucleus grows to a plurality of epitaxial crystal grains along the direction perpendicular the epitaxial growth surface 101. In the second stage, the plurality of epitaxial crystal grains grows to a continuous epitaxial film along the direction parallel to the epitaxial growth surface 101. In the third stage, the epitaxial film continuously grows along the direction perpendicular to the epitaxial growth surface 101 to form a high quality epitaxial film, the epitaxial growth grains, epitaxial film and the high-quality epitaxial film constitute the first semiconductor layer 120.

In the first stage, because the first carbon nanotube layer 110 is located on the epitaxial growth surface 101, the epitaxial crystal grains are only grown from the exposed epitaxial growth surface 101 through the apertures 112. The process of epitaxial crystal grains growing along the direction substantially perpendicular to the epitaxial growth surface 101 is called vertical epitaxial growth.

In the second stage, the epitaxial crystal grains can grow along the direction parallel to the epitaxial growth surface 101. The epitaxial crystal grains are gradually joined together to form the epitaxial film to cover the first carbon nanotube layer 110. During the growth process, the epitaxial crystal grains will grow around the carbon nanotubes, and then a plurality of grooves 122 will be formed in the first semiconductor layer 110 where the carbon nanotubes exist. The extending direction of the grooves 122 is parallel to the orientated direction of the carbon nanotubes. The carbon nanotubes are located into the grooves 122 and enclosed by the first semiconductor layer 120 and the substrate 100, thus the carbon nanotubes will be semi-enclosed by the first semiconductor layer 120. An inner wall of the grooves 122 can be in contact with the carbon nanotubes or spaced from the carbon nanotubes, which depends on whether the material of the epitaxial film and the carbon nanotubes have mutual infiltration. Each groove 122 includes at least one carbon nanotube. The carbon nanotubes in the grooves 122 are joined by van der Waals force to form the first carbon nanotube layer 110. The shape of the grooves 122 correspond to the patterned first carbon nanotube layer 110. The maximum width of the grooves 122 ranges from about 20 nm to about 200 nm. The maximum width means that the maximum size along the direction perpendicular to the extending direction of the grooves 122. In one embodiment, the maximum width of the grooves 122 ranges from about 50 nm to about 100 nm. The plurality of grooves 122 forms a patterned surface on the first semiconductor layer 120. The patterned surface of the first semiconductor layer 120 is similar to the first carbon nanotube layer 110.

While the first carbon nanotube layer 110 includes a carbon nanotube film or a plurality of intersected carbon nanotube wires, the plurality of grooves 122 are interconnected with each other to form a continuous network structure. The carbon nanotubes are also interconnected with each other to form a conductive structure. While the first carbon nanotube layer 110 includes a plurality of carbon nanotube wires parallel to each other, the plurality of grooves 122 will be parallel to each other. The grooves 122 are aligned with a certain interval, the distance between the two adjacent grooves 122 is substantially equal to the distance between the two adjacent carbon nanotube wires.

Figure 7:
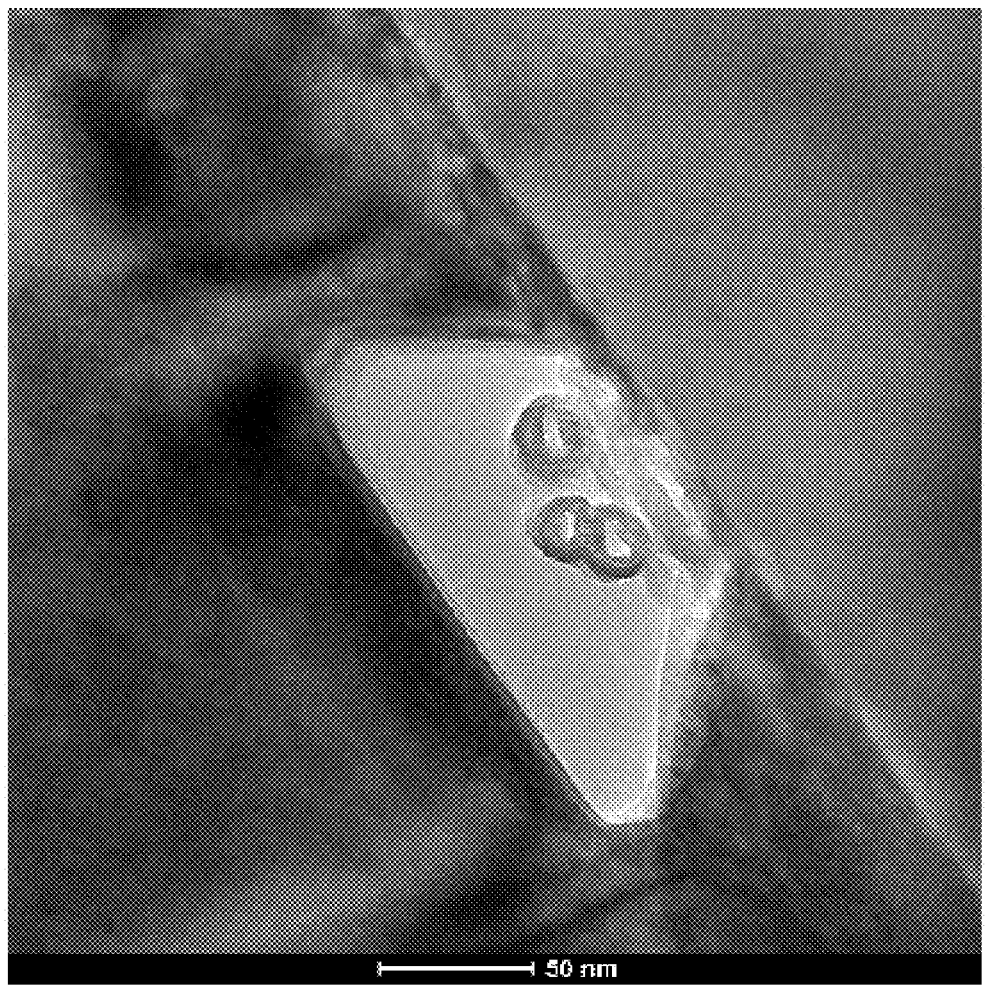
FIG. 7 shows a Transmission Electron Microscopy (TEM) of a cross-section of a junction between the first semiconductor layer and the substrate.

Also referring to FIG. 7, a cross-section of a junction between the first semiconductor layer 120 and the substrate 100 is shown. The dark-colored layer is the first semiconductor layer 120, and the light-colored layer is the substrate 100. The grooves 122 exist on the face of the first semiconductor layer 120. The carbon nanotubes are semi-enclosed by the grooves 122 and attached on the surface of the substrate 100. In one embodiment, the carbon nanotubes are spaced from the first semiconductor layer 120.

The active layer 130 is deposited on the first semiconductor layer 120. The thickness of the active layer 130 ranges from about 0.01 µm to about 0.06 µm. The active layer 130 is a photon excitation layer and can be one of a single layer quantum well film or multilayer quantum well films. The active layer 130 is made of GaInN, AlGaInN, GaSn, AlGaSn, GaInP, or GaInSn. In one embodiment, the active layer 130 has a thickness of about 0.3 µm and includes one layer of GaInN and another layer of GaN. The GaInN layer is stacked with the GaN layer. The growth method of the active layer 130 is similar to the first semiconductor layer 120. In one embodiment, the indium source gas is trimethyl indium. The growth of the active layer 130 after the growth of the first semiconductor layer 120 includes the following steps:

(a1) stopping the flow of the Si source gas and maintaining the temperature of the reaction chamber in a range from about 700° C. to about 900° C., and the pressure of the reaction chamber ranges from about 50 torrs to about 500 torrs; and (a2) introducing the indium source gas and growing an InGaN/GaN multilayer quantum well film to form the active layer 130.

The thickness of the second semiconductor layer 140 ranges from about 0.1 µm to about 3 µm. The second semiconductor layer 140 can be an N-type semiconductor layer or a P-type semiconductor layer. Furthermore, the type of the second semiconductor layer 140 is different from the type of the first semiconductor layer 120. A surface of the second semiconductor layer 140 is used as an extraction surface of the LEDs. In one embodiment, the second semiconductor layer 140 is a P-type gallium nitride doped with Mg. The thickness of the second semiconductor layer 140 is about 0.3 µm. The growth of the second semiconductor layer 140 is similar to the first semiconductor layer 120. The second semiconductor 140 is grown after the growth of the active layer 130. In one embodiment, the Mg source gas is ferrocene magnesium ($Cp_2Mg$), the method includes the following steps:

(b1) stopping the flow of the indium source gas and maintaining the temperature of the reaction chamber in a range from about 1000° C. to about 1100° C., and maintaining the pressure of the reaction chamber to a range from about 76 torrs to about 200 torrs; and (b2) growing P-type gallium nitride doped with Mg to form the second semiconductor layer 140 by introducing the Mg source gas.

In step (S14), the upper electrode 150 can be an N-type electrode or P-type electrode, the type of the upper electrode 150 is same as the second semiconductor layer 140. The shape of the upper electrode 150 is arbitrary and can be selected according to need. The upper electrode 150 is located and contacted on a region of the surface of the second semiconductor layer 140. The upper electrode 150 is located on the extraction surface of the LED 10. The extraction efficiency of the LED 10 is not affected by the shape and the location of the upper electrode 150. While the upper electrode 150 is transparent, the upper electrode 150 can cover the whole extraction surface. The upper electrode 150 is can be single layer structure or a multi-layer structure. The material of the upper electrode 150 can be selected from titanium (Ti), silver (Ag), aluminum (Al), nickel (Ni), gold (Au), or any combination thereof. The material of the upper electrode 150 can also be indium-tin oxide (ITO) or carbon nanotube film. In one embodiment, the upper electrode 150 is a P-type electrode and located on one side of the second semiconductor layer 140. The upper electrode 150 is a two-layer structure consisting of a Ti layer with a thickness of about and an Au layer with a thickness of about 100 nm in thickness.

The upper electrode 150 is placed on the second semiconductor layer 140 via a process of physical vapor deposition, such as electron beam evaporation, vacuum evaporation, ion sputtering, or physical deposition. In one embodiment, the upper electrode 150 formed on the second semiconductor layer 140 via a physical deposition method includes:

(S141) coating a layer of photo resist on the top surface of the second semiconductor layer 140;

(S142) removing a portion of the photo resist to expose the second semiconductor layer 140;

(S143) depositing the upper electrode 150 on the top surface of the second semiconductor layer 140 where the layer of photo resist has been removed; and (S144) removing the residual photo resist via an organic solvent, such as acetone to form the upper electrode 150.

In step (S15), the substrate 100 can be removed by laser irradiation, etching, or thermal expansion and contraction. The removal method can be selected according to the material of the substrate 100 and the first semiconductor layer 120. In one embodiment, the substrate 100 is removed by laser irradiation. The substrate 100 is removed from the first semiconductor layer 120 by the following steps:

(S151) polishing and cleaning the surface of the substrate 100 away from the first semiconductor layer 120;

(S152) placing the substrate 100 on a platform (not shown) and irradiating the substrate 100 and the first semiconductor layer 120 by a laser; and (S153) immersing the substrate 100 into a solvent to remove the substrate 100.

In step (S151), the substrate 100 can be polished by a mechanical polishing method or a chemical polishing method to obtain a smooth surface. Thus the scatting of the laser will be reduced. The substrate 100 can be cleaned with hydrochloric acid or sulfuric acid to remove the metallic impurities and oil.

In step (S152), the substrate 100 is irradiated by the laser from the polished surface, and the incidence angle of the laser is perpendicular to the surface of the substrate 100. The wavelength of the laser is selected according to the material of the first semiconductor layer 120 and the substrate 100. The energy of the laser is less than the bandgap of the substrate 100 and larger than the bandgap of the first semiconductor layer 120. Thus the laser can pass through the substrate 100 and reach the interface between the substrate 100 and the first semiconductor layer 120. The buffer layer 1202 at the interface has a strong absorption of the laser, and the temperature of the buffer layer 1202 will be raised rapidly. Thus the buffer layer 1202 will decompose. In one embodiment, the bandgap of the first semiconductor layer 120 is about 3.3 eV, and the bandgap of the substrate 100 is about 9.9 eV. The laser is a KrF laser, the wavelength of the laser is about 248 nm, and the energy is about 5 eV, the pulse width range about 20 nanoseconds to about 40 nanoseconds, the energy density ranges from about 400 mJ/cm$^2$ to about 600 mJ/cm$^2$, and the shape of the laser pattern is square with a size of 0.5 mm×0.5 mm. The laser moves from one edge of the substrate 100 at a speed of 0.5 mm/s During the irradiating process, the GaN is decomposed to Ga and $N_2$. It is understood that the parameter of the laser can be adjusted according to need. The wavelength of the laser can be selected according to the absorption of the buffer layer 1202.

The buffer layer 1202 is decomposed rapidly because the buffer layer 1202 has a strong absorption of the laser. However, the first semiconductor layer 120 has a weak absorption of the laser, so it cannot be decomposed. The irradiating process can be performed in a vacuum or a protective gas environment to prevent the oxidation of the carbon nanotubes. The protective gas can be nitrogen, helium, argon, or other inert gas.

In step (S153), the substrate 100 can be immersed in an acidic solution to remove the Ga decomposed from GaN, so that the substrate 100 can be peeled off from the first semiconductor layer 120. In one embodiment, the first carbon nanotube layer 110 is directly attached on the epitaxial growth surface 101 of the substrate 100, so the carbon nanotubes can be peeled off with the substrate 100 together. During the peeling process, the shape and the distribution of the grooves are not changed.

In the thermal expansion and contraction method, the substrate 100 is heated to a temperature above 1000° C. and cooled to a temperature below 1000° C. in a short time of about 2 minutes to about 20 minutes. The substrate 100 separates from the first semiconductor layer 110 by cracking because of the thermal expansion mismatch between the substrate 100 and the first semiconductor layer 110.

In step (S16), the lower electrode 160 is placed on the first semiconductor layer 120 via a process of physical vapor deposition, such as electron beam evaporation, vacuum evaporation, ion sputtering, or physical deposition. Furthermore, the lower electrode 160 can be formed by applying a conductive plate on the first semiconductor layer 120 via a conductive adhesive. The lower electrode 160 can be an N-type electrode or P-type electrode. The type of the lower electrode 160 is the same as the first semiconductor layer 120. The lower electrode 160 can be a single layer structure or a multi-layer structure. The material of the lower electrode 160 can be titanium (Ti), silver (Ag), aluminum (Al), nickel (Ni), gold (Au), or any combination. The lower electrode 160 is configured as a reflective layer, a conductive electrode, and a heatsink at the same time. In one embodiment, the lower electrode 160 is a two-layer structure consisting of a Ti layer with 15 nm in thickness and an Au layer with 200 nm in thickness. The Au layer is attached on the first semiconductor layer 120. The patterned surface of the first semiconductor layer 120 can be partly covered by the lower electrode 160. In one embodiment, the whole patterned surface of the first semiconductor layer 120 is covered by the lower electrode 160, so that more photons can be reflected by the lower electrode 160 and extracted from the light extraction surface, thus improving the extraction efficiency of the LED 10. At the same time, the heat produced by the LED 10 can be conducted out, thereby decreasing the temperature of the LED 10 and prolonging the life of the LED 10.

The method for making the LED 10 has many advantages. First, the carbon nanotube layer is a free-standing structure, thus it can be directly located on the surface of the substrate and the complex sputtering process is not required. Second, due to the existence of the carbon nanotubes, the plurality of grooves are formed in the LED, thus the complex etching method can be avoided and the damage to the lattice structure of the LED is reduced. Third, because the diameter of the carbon nanotubes and the width of the grooves is so small, the extraction efficiency of the LED is improved. Fourth, the carbon nanotube layer is a graphical structure and the thickness and the size of the apertures are small. While it is used to grow the epitaxial layer, the epitaxial grains will have a smaller size, the dislocation will be reduced, and the quality of the semiconductor layer will be improved.

Figure 8:
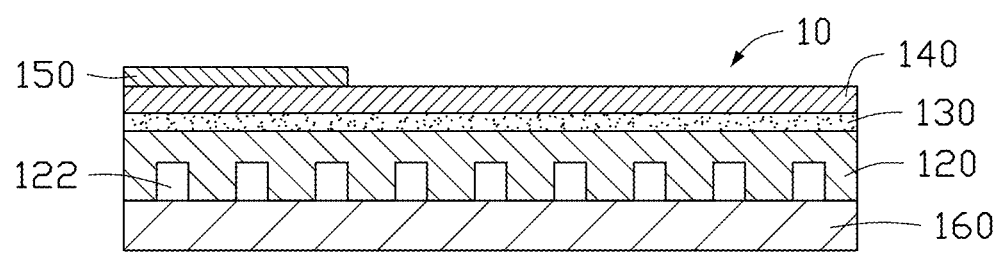
FIG. 8 shows a schematic view of one embodiment of a LED made according to the method of FIG. 1.

Referring to FIG. 8, an LED 10 includes a first semiconductor layer 120, an active layer 130, a second semiconductor layer 140, an upper electrode 150, and a lower electrode 160. The active layer 130 is sandwiched between the first semiconductor layer 120 and the second semiconductor layer 140.

The lower electrode 160 is electrically connected with the first semiconductor layer 120, and the upper electrode 150 is electrically connected with the second semiconductor layer 140. The surface of the second semiconductor layer 140 away from the active layer 130 is used as the light extraction surface. The surface of the first semiconductor layer 120 which is connected with the lower electrode 160 includes a plurality of grooves 122 to form a patterned surface. The width of the grooves 122 range from about 50 nm to about 100 nm.

When the photons generated from the active layer 130 reaches the plurality of grooves 122 with a large incident angle, the moving direction of the photons will be changed. After the photons are reflected by the lower electrodes 160, the photons can pass through the light extraction surface, and the extraction efficiency of the LED 10 will be improved.

Figure 9:
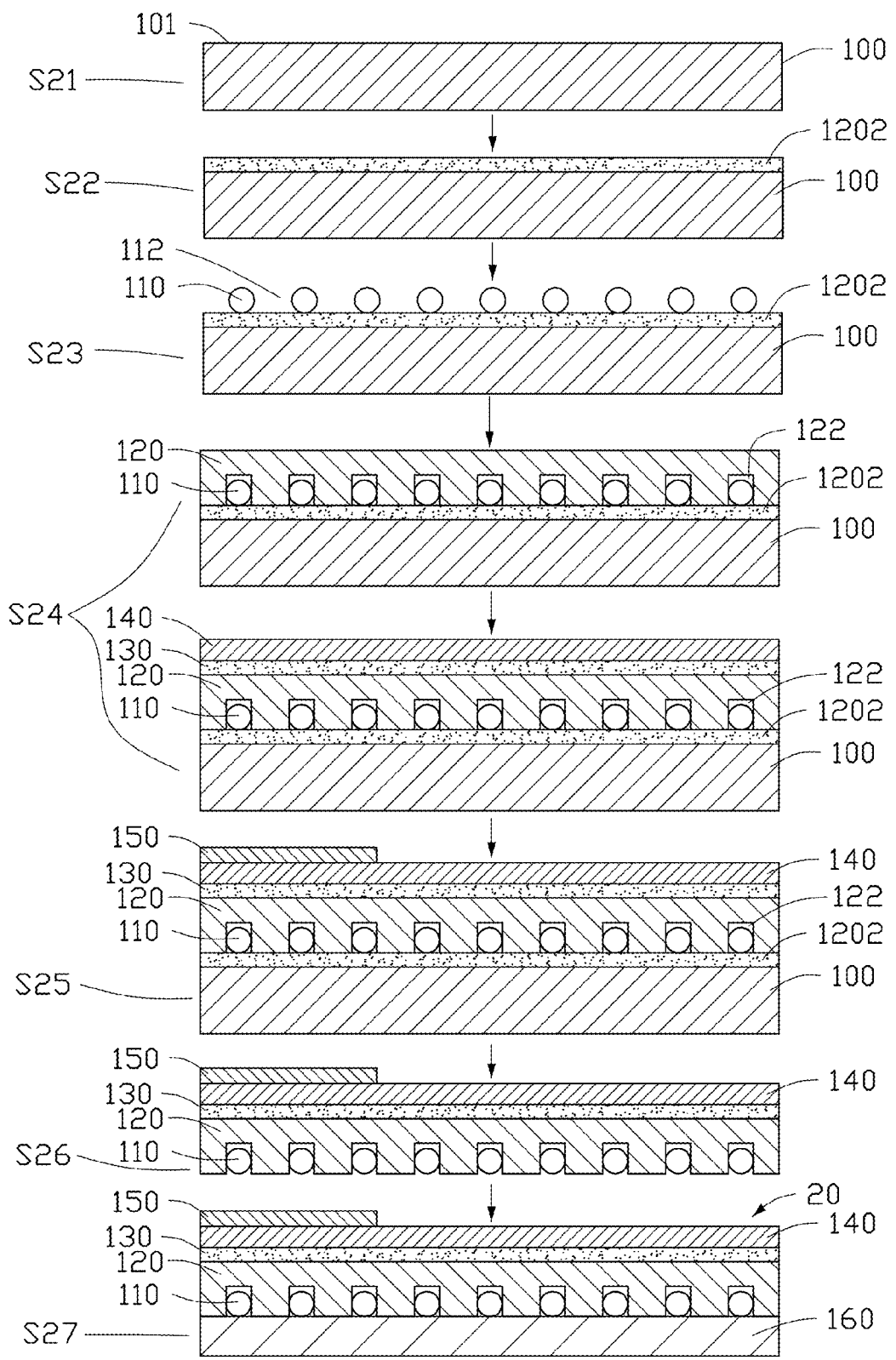
FIG. 9 is a flowchart of another embodiment of a method for making a LED.

Referring to FIG. 9, a method for making an LED 20 includes the follow steps:

(S21) providing a substrate 100, the substrate includes an epitaxial growth surface 101;

(S22) growing a buffer layer 1202 on the epitaxial growth surface 101;

(S23) placing a first carbon nanotube layer 110 on the buffer layer 1202;

(S24) growing a first semiconductor layer 120, an active layer 130, and a second semiconductor layer 140 in that order on the buffer layer 1202 and the first carbon nanotube layer 110;

(S25) depositing a upper electrode 150 on a surface of the second semiconductor layer 140;

(S26) removing the substrate 100 and exposing the first carbon nanotube layer 110; and (S27) applying a lower electrode 160 on the first semiconductor layer 120 and electrically connect with the first carbon nanotube layer 110.

The method for making the LED 20 is similar to the method for making the LED 10 except that the buffer layer 1202 grows on the substrate 100 before placing the first carbon nanotube layer 110.

In step (S22), the method of growing the buffer layer 1202 is similar to the first semiconductor layer 110. The material of the buffer layer 1202 is selected from Si, GaAs, GaN, GaSb, InN, InP, InAs, InSb, AlP, AlAs, AlSb, AlN, GaP, SiC, SiGe, GaMnAs, GaAlAs, GaInAs, GaAlN, GaInN, AlInN, GaAsP, InGaN, AlGaInN, AlGaInP, GaP:Zn or GaP:N, according to the first semiconductor layer 110. In one embodiment, the buffer layer 1202 is the low-temperature GaN used to reduce the dislocation of the first semiconductor layer 120.

In one embodiment, the buffer layer 1202 is fabricated by a MOCVD method. The nitrogen source gas is high-purity $NH_3$, the carrier gas is $H_2$, the Ga source gas is TEGa or TEGa. The growth of the buffer layer 1202 includes the following steps:

(S221) placing the substrate 100 into a reaction chamber and heating the substrate 100 to about 1100° C. to about 1200° C., introducing the carrier gas and baking the substrate 100 for about 200 s to about 1000 s;

(S222) cooling down the temperature to a range from about 500° C. to about 650° C. in the carrier gas atmosphere, introducing the Ga source gas and the nitrogen source gas at the same time to grow low-temperature GaN layer.

In step (S23), the first carbon nanotube layer 110 is placed on the buffer layer 1202. The carbon nanotubes are electrically contacted with the buffer layer 1202. While the first carbon nanotube layer 110 is placed on the buffer layer 1202, the plurality of carbon nanotubes are aligned parallel to the surface of the buffer layer 1202. The first carbon nanotube layer 110 includes a plurality of apertures 112, and the buffer layer 1202 is exposed from the first carbon nanotube layer 110 through the apertures 112.

In step (S24), the Ga source gas is TMGa) or TEGa, the Si source gas is $SiH_4$, and the method of growing the first semiconductor layer 120 includes three stages. In the first stage, a plurality of epitaxial crystal nucleus forms on the buffer layer 1202, and the epitaxial crystal nucleus grow a plurality of epitaxial crystal grains along the direction perpendicular the buffer layer 1202. In the second stage, the plurality of epitaxial crystal grains are joined together to form a continuous epitaxial film along the direction parallel to the surface of buffer layer 1202. In the third stage, the epitaxial film continuously grows along the direction perpendicular to the surface of the buffer layer 1202 to form the first semiconductor layer 120.

In the second stage, during the growth process, the epitaxial crystal grains will grow around the carbon nanotubes and join together, and a plurality of grooves 122 will be formed in the first carbon nanotube layer 110 at the carbon nanotubes. The carbon nanotubes are located into the grooves 122 and enclosed by the first semiconductor layer 120 and the buffer layer 1202, thus the carbon nanotubes will be semi-enclosed by the first semiconductor layer 120. The surface of the carbon nanotubes will be partly attached on the inner surface of the grooves 122. The plurality of grooves 122 form a patterned surface of the first semiconductor layer 120. The patterned surface of the first semiconductor layer 120 is similar to the first carbon nanotube layer 110.

In step (S26), the substrate 100 can be removed by the method mentioned above. However, the buffer layer 1202 is sandwiched between the first carbon nanotube layer 110 and the substrate 100, thus the carbon nanotubes are not directly attached on the surface of the substrate 100 and cannot be peeled of with the substrate 100. While the buffer layer 1202 is irradiated by the laser, the buffer layer 1202 will be decomposed, and the buffer layer 1202 will be dissolved in the solution. Thus the first carbon nanotube layer 110 will be detached from the buffer layer 1202, and the carbon nanotubes will be preserved in the grooves 122. Due to the buffer layer 1202, damage to the grooves 122 will be reduced during the peeling process. The carbon nanotubes can also decrease the contact surface between the buffer layer 1202 and the first semiconductor layer 120, thus the stress will be reduced.

Figure 10:
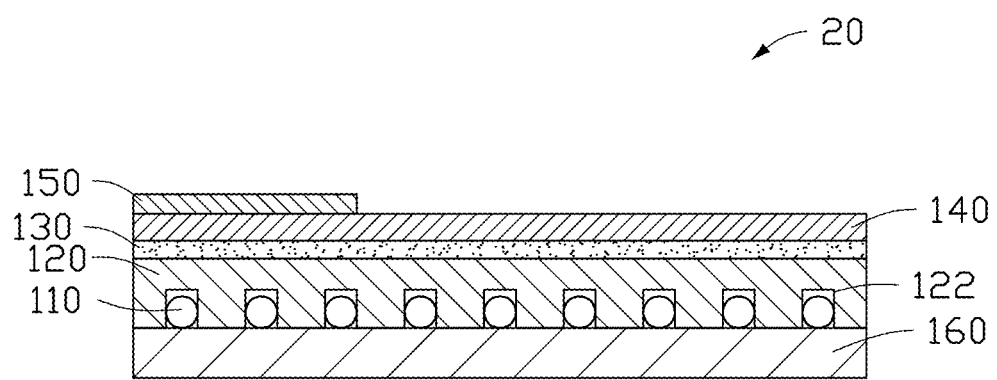
FIG. 10 shows a schematic view of one embodiment of a LED made according to the method of FIG. 9.

Also referring to FIG. 10, an LED 20 includes a first carbon nanotube layer 110, a first semiconductor layer 120, an active layer 130, a second semiconductor layer 140, a lower electrode 160, and an upper electrode 150. The active layer 130 is sandwiched between the first semiconductor layer 120 and the second semiconductor layer 140. The lower electrode 160 is electrically connected with the first semiconductor layer 120, and the upper electrode 150 is electrically connected with the second semiconductor layer 140. The surface of the first semiconductor layer 120, which connects with the lower electrode 160 includes a plurality of grooves 122. The carbon nanotubes of the first carbon nanotube layer 110 are embedded into the grooves 122. The carbon nanotubes are exposed from the first semiconductor layer 120 through the grooves 122 and connected with the lower electrode 160.

Each groove 122 has at least one carbon nanotube therein. The carbon nanotubes in the grooves 122 are joined by van der Waals force to form the first carbon nanotube layer 110. The surface of the carbon nanotubes will be partly attached on the inner surface of the grooves 122. Because the carbon nanotubes have a strong specific surface, the carbon nanotubes will be fixed in the grooves 122.

In one embodiment, the first carbon nanotube layer 110 is a carbon nanotube film. The carbon nanotube film includes a plurality of carbon nanotubes oriented along a preferred orientation. In the orientation, the carbon nanotubes are joined end to end. In the direction perpendicular to the orientation, a plurality of gaps or micro-holes exist between some adjacent carbon nanotubes. The gaps or micro-holes form the apertures 112. The first carbon nanotube layer 110 includes a plurality of apertures 112. The first semiconductor layer 120 is partly filled into the apertures 112.

Furthermore, the first carbon nanotube layer 110 can also include a plurality of carbon nanotube wires parallel with each other. Each of the carbon nanotube wires is fixed into a groove 122. The distance between two adjacent carbon nanotube wires range from about 0.1 μm to about 200 μm. In one embodiment, the distance ranges from about 10 μm to about 100 μm. The interval between the adjacent two carbon nanotube wires forms the apertures 112 of the first carbon nanotube layer 110. The smaller the size of the apertures 112, the less dislocations will exist in the growth of the first semiconductor layer 120, and the quality of the semiconductor layer 120 will be improved.

In one embodiment, the first carbon nanotube layer 110 can also include a plurality of carbon nanotube wires intersected with each other. Some carbon nanotube wires extend along a first direction, and some carbon nanotube wires extend along a second direction. The first direction and the second direction are intersected. In one embodiment, the first direction and the second direction are substantially perpendicular with each other. Thus the surface of the first semiconductor layer 120 includes a plurality of grooves 122 intersected with each other.

In the LED 20, the carbon nanotube layer is a free-standing structure, and the carbon nanotubes of the carbon nanotube layer have a large contact surface with the electrode. Thus, the heat produced by the LED can be quickly conducted out of the LED. Furthermore, the conduction current in the LED can be uniformly dispersed.

Figure 11:
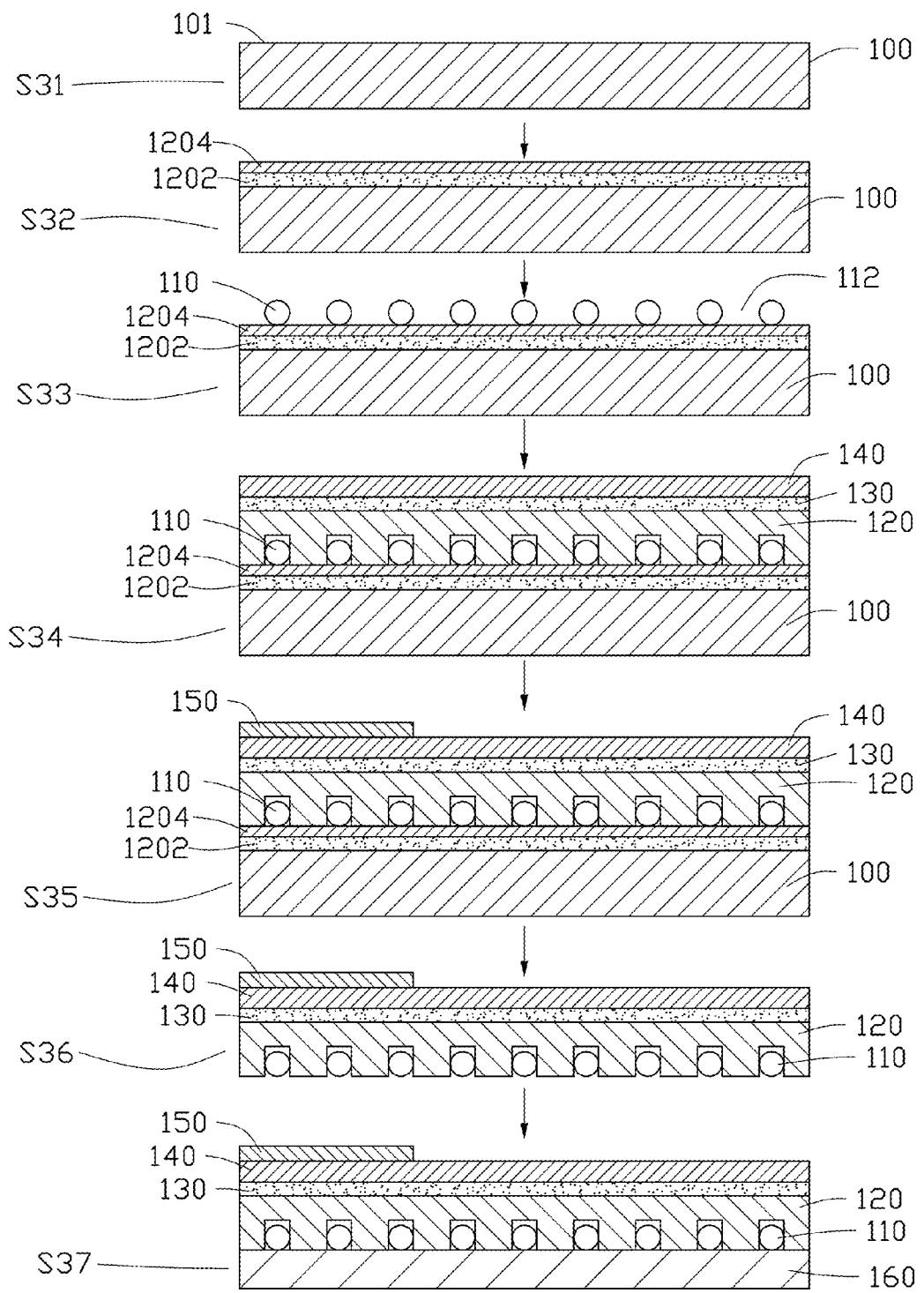
FIG. 11 is a flowchart of another embodiment of a method for making a LED.

Referring to FIG. 11, a method for making the LED 20 includes the following steps:

(S31) providing a substrate 100, wherein the substrate 100 includes an epitaxial growth surface 101;

(S32) growing a buffer layer 1202 and an intrinsic semiconductor layer 1204 in that order on the epitaxial growth surface 101;

(S33) placing a first carbon nanotube layer 110 on the intrinsic semiconductor layer 1204;

(S34) growing a first semiconductor layer 120, an active layer 130, and a second semiconductor layer 140 in that order on the intrinsic semiconductor layer 1204 and the first carbon nanotube layer 110;

(S35) depositing an upper electrode 150 on a surface of the second semiconductor layer 140;

(S36) removing the substrate 100 and exposing the first carbon nanotube layer 110; and (S37) depositing a lower electrode 160 on a surface of the first carbon nanotube layer 110.

In step (S32), the method of growing the intrinsic semiconductor layer 1204 on the buffer layer 1202 includes the following steps:

(S321) keeping the temperature of the reaction chamber at a range from about 1000° C. to about 1100° C. and the pressure in a range from about 100 torr to about 300 torr;

(S322) introducing the Ga source gas and growing the intrinsic semiconductor layer 1204 on the buffer layer 1202.

In step (S322), the thickness of the intrinsic semiconductor layer 1204 ranges from about 10 nm to about 1 μm.

In step (S34), the surface of the intrinsic semiconductor layer 1204 is partly exposed through the apertures 112 of the first carbon nanotube layer 110, and the epitaxial grains grow on the surface and pass through the apertures 112 to form the first semiconductor layer 120. The active layer 130 and the second semiconductor layer 140 grow on the surface of the intrinsic semiconductor layer 1204 in that order.

In step (S36), during the process of removing the substrate 100 with laser, the buffer layer 1202 is decomposed and resolved in the acidic solution, thus the substrate 100 is peeled off. Furthermore, the intrinsic semiconductor layer 1204 can also be decomposed in the acidic solution at the same time, thus the first carbon nanotube layer 110 will be exposed. Furthermore, the intrinsic semiconductor layer 1204 can be removed by ion etching or wet etching.

Because the intrinsic semiconductor layer 1204 grows on the buffer layer 1202, thus the dislocations in the first semiconductor layer 120, the active layer 130 and the second semiconductor layer 140 will be reduced, and the quality of them will be improved. Thus the light extraction efficiency of the LED 20 will be improved.

Figure 12:
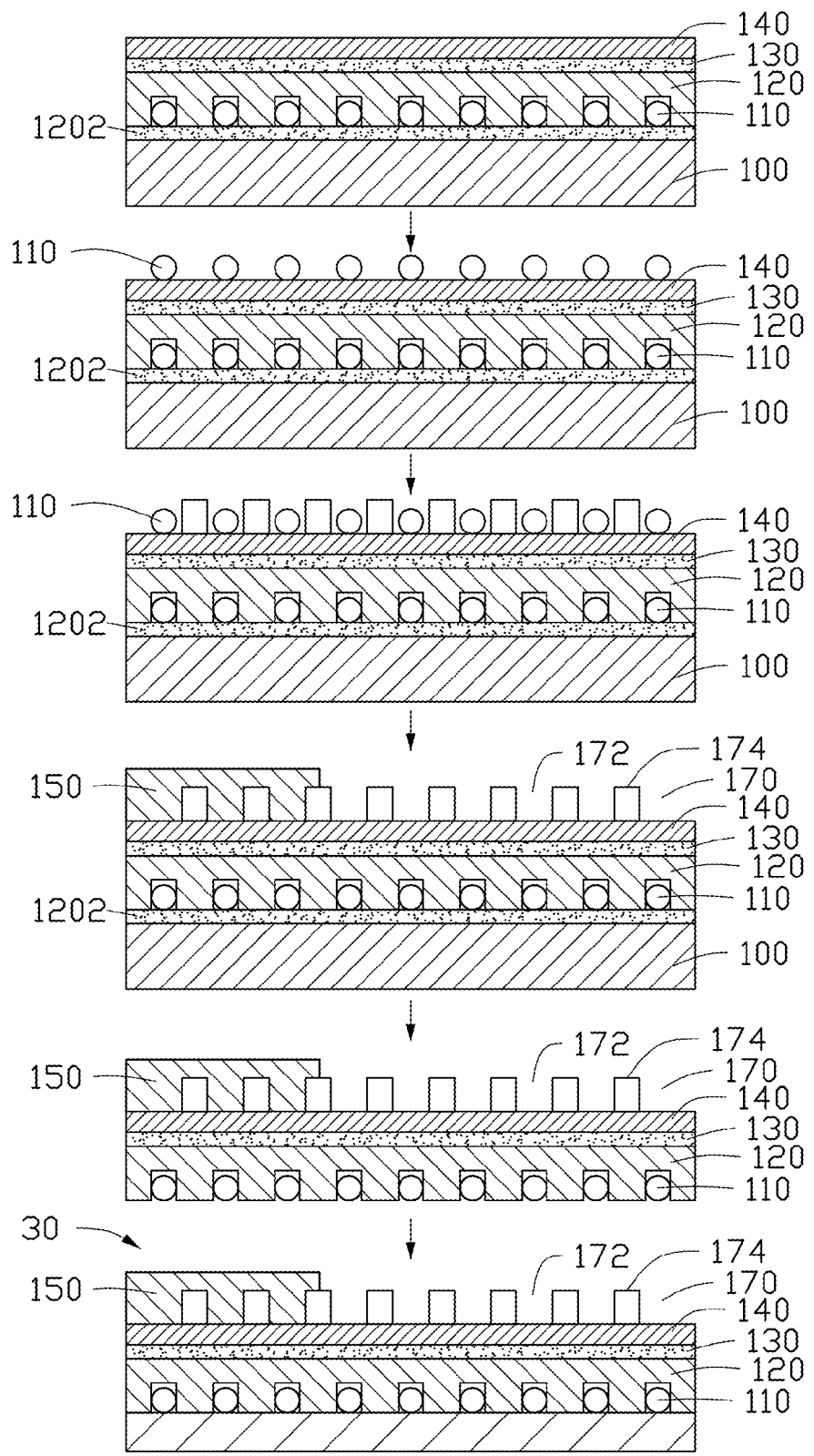
FIG. 12 is a flowchart of another embodiment of a method for making a LED.

Referring to FIG. 12, a method for making the LED 30 includes following steps:

(S41) providing a substrate 100, wherein the substrate 100 includes an epitaxial growth surface 101;

(S42) growing a buffer layer 1202 on the epitaxial growth surface 101;

(S43) placing a first carbon nanotube layer 110 on the buffer layer 1202;

(S44) growing a first semiconductor layer 120, an active layer 130, a second semiconductor layer 140 in that order on the buffer layer 1202 and the first carbon nanotube layer 110;

(S45) forming a plurality of microstructures 174 on a surface of the second semiconductor layer 140;

(S46) depositing an upper electrode 150 on the surface of the second semiconductor layer 140 where the microstructures 174 is located;

(S47) removing the substrate 100 and exposing the first carbon nanotube layer 110; and (S48) depositing a lower electrode 160 on a surface of the first carbon nanotube layer 110.

The method for making the LED 30 is similar to the method for making the LED 20. The difference is that the method for making the LED 30 further includes a step (S45) of forming a plurality of microstructures 174.

In step (S45), the method of forming the plurality of microstructures can be lithography or growth method. Referring to FIG. 12, in one embodiment, the microstructures 174 are formed by the following steps:

(S451) placing a second carbon nanotube layer 180 on the surface of the second semiconductor layer 140;

(S452) growing a third semiconductor layer 170 on the second conductor layer 140 and the second carbon nanotube layer 180; and (S453) removing the second carbon nanotube layer 180 located on the second semiconductor layer 140.

In step (S451), the second carbon nanotube layer 180 is configured as the mask layer to grow the third semiconductor layer 170. The structure of the second carbon nanotube layer is same as that of the first carbon nanotube layer 110. The third semiconductor layer 170 can only grow from the apertures 112 of the second carbon nanotube layer 180. The second carbon nanotube layer 180 includes a plurality of apertures 112, thus the second carbon nanotube layer 180 can be configured as the patterned mask layer. While the second carbon nanotube layer 180 is located on the second semiconductor layer 140, the carbon nanotubes of the second carbon nanotube layer 180 is parallel to the surface of the second semiconductor layer 140.

In step (S452), a plurality of epitaxial grains grows on a surface of the second semiconductor layer 140. The growth direction of the epitaxial grains is perpendicular to the surface of the second semiconductor layer 140. During the growth process, the microstructures 174 are formed on the surface of the second semiconductor layer 140. The surface of the semiconductor layer 140 on which the microstructures 174 is located is used as the light extraction surface of the LED. The shape of the microstructures 174 is the same as the shape of the apertures 112. In one embodiment, the carbon nanotubes of the second carbon nanotube layer 180 are oriented substantially along the same direction, thus the shape of the microstructures 174 is in a shape of bar. The microstructures 174 are parallel with each other and spaced from each other. The microstructures 174 are oriented substantially along the same direction and parallel to the surface of the second semiconductor layer 140. The oriented direction of the microstructures 174 is the same as the carbon nanotubes thereof. The microstructures 174 constitute the third semiconductor layer 170. The thickness of the third semiconductor layer 170 is about 2 μm. A slot 172 is formed between the adjacent two microstructures 174. The maximum width of the slot 172 ranges from about 20 nm to about 200 nm. The carbon nanotubes of the second carbon nanotube layer 180 are located in the slot 172.

In one embodiment, the second carbon nanotube layer 180 includes a plurality of carbon nanotube films intersected with each other or a plurality of carbon nanotube wires intersected with each other. The epitaxial grains grow from the apertures 112 to form a plurality of dot-like microstructures 174. The dot-like microstructures 174 are dispersed on the surface of the second semiconductor layer 140. The maximum size of the dot-like microstructures 174 ranges from about 10 nm to about 10 μm.

The material of the microstructures 174 is arbitrary, and can be GaN, GaS and $Cu_3P_2$. The material of the microstructures 174 can be same as the second semiconductor layer 140. In one embodiment, the material of the microstructures 174 is GaN doped with Mg.

In step (S453), the second carbon nanotube layer 180 can be removed by plasma etching, ultrasonic oscillation, laser heating, or reaction chamber heating. In one embodiment, the second carbon nanotube layer 180 is removed by laser heating. The method of removing the second carbon nanotube layer 180 includes the following steps:

(c1) providing a laser device, irradiating the second carbon nanotube layer 180 with the laser transmitted by the laser device;

(c2) scanning the second carbon nanotube layer 180 with the laser in an oxidized atmosphere.

The laser device can be solid lasers, liquid lasers, gas lasers, or semiconductor lasers. The power density of the laser is greater than $0.053 \times 10^{12}$ watt/$m^2$. The diameter of the light spot ranges from about 1 mm to about 5 mm. The irradiation time is less than 1.8 second. In one embodiment, the laser device is $CO_2$ laser, the power density is about 30 watt, the wavelength is about 10.6 μm and the diameter of the light spot is about 3 mm.

The carbon nanotubes on the second semiconductor layer 140 can be ablated by the laser. The irradiation time of the laser can be controlled by controlling the moving speed of the laser relative to the second carbon nanotube layer 180. The carbon nanotubes will be oxidized to $CO_2$. The greater the laser power and the slower the moving speed, the greater the energy absorbed by the carbon nanotubes and the quicker the ablation. In one embodiment, the moving speed of the laser is about 10 mm relative to the carbon nanotube layer. The second carbon nanotube layer 180 can be scanned by the laser in a direction parallel to the oriented direction of the carbon nanotubes. The scanning direction can also be perpendicular to the oriented direction of the carbon nanotubes.

The upper electrode 150 is placed on the second semiconductor layer 140 via a process of physical vapor deposition, such as electron beam evaporation, vacuum evaporation, ion sputtering, or physical deposition. In one embodiment, the upper electrode 150 is formed on the second semiconductor layer 140 via electron beam evaporation method. The second semiconductor layer 140 includes a plurality of microstructures 174. A slot 172 is defined between every two adjacent microstructures 174. During the process of placing the upper electrode 150 on the second semiconductor layer 140, one part of the upper electrode 150 is deposited on the microstructures 174, and another part is deposited in the caves 172 and connected with the second semiconductor layer 140. Thus the upper electrode 150 is electrically connected with the second semiconductor layer 140.

Furthermore, the second carbon nanotube layer 180 is not removed from the second semiconductor layer 140, and the second carbon nanotube layer 180 will remain in the slots 172. Thus the upper electrode 150 can be formed on the third semiconductor layer 170 and electrically connected with the second carbon nanotube layer 180. The second carbon nanotube layer 180 is conductive, so it can be functional as an electrode to disperse the current flowing in the LED 30.

The method of forming the microstructures on the light extraction surface of the LED via the carbon nanotube layers has many advantages. One is the method is simple and the cost is lower compared with the etching and nano-imprint lithography method. Another is that the carbon nanotube layer is a free-standing structure and can be directly placed on the third semiconductor layer, thus it can be conveniently used in large-scale industrial production.

Figure 13:
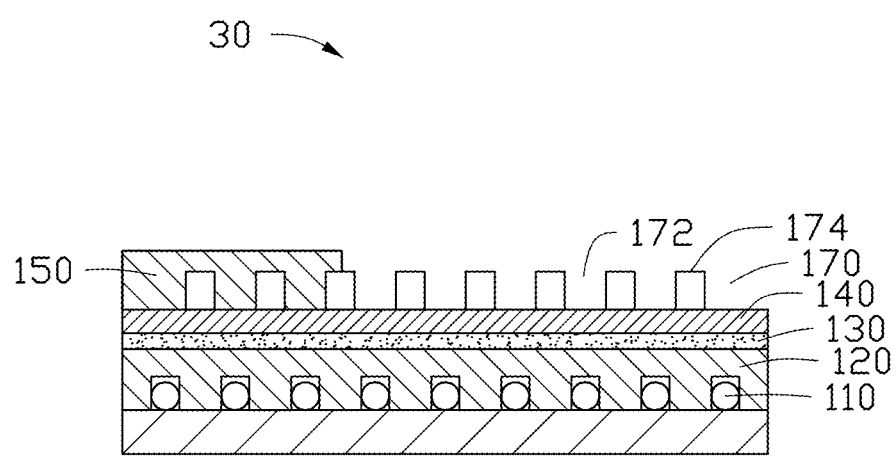
FIG. 13 shows a schematic view of one embodiment of a LED made according to the method of FIG. 12.

Referring to FIG. 13, a LED 30 includes a first carbon nanotube layer 110, a first semiconductor layer 120, an active layer 130, a second semiconductor layer 140, a lower electrode 150, and an upper electrode 160. The active layer 130 is sandwiched between the first semiconductor layer 120 and the second semiconductor layer 140. The lower electrode 160 is electrically connected with the first semiconductor layer 120, and the upper electrode 150 is electrically connected with the second semiconductor layer 140. The surface of the first semiconductor layer 120 is connected with the lower electrode 160 and includes a plurality of grooves 122. The carbon nanotubes of the second carbon nanotube layer 180 are embedded into the grooves 122. The carbon nanotubes are exposed from the first semiconductor layer 120 through the grooves 122 and connected with the lower electrode 160. A plurality of microstructures 174 is formed on the surface of second semiconductor layer 140, away from the active layer 130.

The plurality of microstructures 174 are located on the light extraction surface of the LED 30 and spaced from each other. The shape of the microstructures 174 can be a bar or a dot. The extending direction of the bar-shaped microstructures 174 can be substantially parallel or intersect with the grooves 122. An angle between the microstructures 174 and the grooves 122 ranges from about 0 degrees to about 90 degrees. In one embodiment, the angle is about 90 degrees, thus the extending direction of microstructure 174 is substantially perpendicular to the grooves 122. The width of the microstructure 174 ranges from about 10 nm to about 10 μm. A slot 172 is formed between the two adjacent microstructures 174. The maximum width of the slot 172 ranges from about 20 nm and 200 nm. In one embodiment, the maximum width of the slots 172 ranges from about 50 nm to about 100 nm.

The LED 30 includes a plurality of microstructures located on the light extraction surface. As the photons arrive at the light extraction surface with a large angle, the emergence angle of the photons will be changed due to diffraction, and the photons can extract from the LED 30, thus the light extraction efficiency will be improved. Furthermore, a second carbon nanotube layer 180 (not shown) is embedded in the slots 172, thus the emergence angle of the photons can also be changed by the carbon nanotube layer 180.

The method for making the LED has many advantages. First, the carbon nanotube layer is a continuous and free-standing structure, and it can be directly placed on the substrate to grow the epitaxial layer, so the complex sputtering process is avoided. Second, a plurality of microstructures can be formed on the light extraction surface of LED via taking carbon nanotube layers as the mask layer, so the complex etching process can be avoided. Third, because the apertures in the carbon nanotube layer and the microstructures is very small, the light extraction efficiency will be improved. Lastly, because the etching process is avoided, damage to the lattice structure of the LED will be reduced.

Depending on the embodiment, certain of the steps of methods described may be removed, others may be added, and that order of steps may be altered. It is also to be understood that the description and the claims drawn to a method may include some indication in reference to certain steps. However, the indication used is only to be viewed for identification purposes and not as a suggestion as to an order for the steps.

It is to be understood that the above-described embodiments are intended to illustrate rather than limit the disclosure. Variations may be made to the embodiments without departing from the spirit of the disclosure as claimed. It is understood that any element of any one embodiment is considered to be disclosed to be incorporated with any other embodiment. The above-described embodiments illustrate the scope of the disclosure but do not restrict the scope of the disclosure.

What is claimed is:

1. A method of fabricating a light emitting diode, the method comprising:
    providing a substrate having an epitaxial growth surface;
    applying a first carbon nanotube layer on the epitaxial growth surface;
    growing a first semiconductor layer, an active layer, and a second semiconductor layer in that order on the substrate, wherein the first semiconductor layer covers the first carbon nanotube layer;
    applying an upper electrode on a surface of the second semiconductor layer;
    removing the substrate; and
    applying a lower electrode on a surface of the first semiconductor layer.

2. The method of claim 1, wherein the carbon nanotube layer is a continuous and free-standing structure, and the carbon nanotube layer is directly located on the epitaxial growth surface.

3. The method of claim 2, wherein the carbon nanotube layer defines a plurality of apertures, part of the epitaxial growth surface is exposed from the apertures to form an exposed epitaxial growth surface, and the first semiconductor layer grows from the exposed epitaxial growth surface and through the apertures.

4. The method of claim 3, wherein a plurality of grooves is formed on a surface of the first semiconductor layer, and the first carbon nanotube layer is semi-enclosed in the grooves.

5. The method of claim 1, wherein the first carbon nanotube layer comprises a carbon nanotube film, the carbon nanotube film comprises a plurality of carbon nanotubes oriented substantially along the same direction and substantially parallel to the epitaxial growth surface of the substrate.

6. The method of claim 1, wherein the carbon nanotube layer is a composite structure.

7. The method of claim 1, wherein the substrate is removed by laser irradiation, etching, or temperature expansion and contraction.

8. The method of claim 1, wherein the growth method of the first semiconductor layer, the active layer and the second semiconductor layer is selected from the group consisting of molecular beam epitaxy, chemical beam epitaxy, vacuum epitaxy, low temperature epitaxy, selective epitaxy, liquid phase deposition epitaxy, metal organic vapor phase epitaxy, ultra-high vacuum chemical vapor deposition, hydride vapor phase epitaxy, and metal organic chemical vapor deposition.

9. The method of claim 1, wherein the step of growing the first semiconductor layer comprises:
    forming a plurality of epitaxial crystal nuclei on the epitaxial growth surface, and the epitaxial crystal nuclei grow to a plurality of epitaxial crystal grains along a direction substantially perpendicular to the epitaxial growth surface;
    forming a continuous epitaxial film along the direction substantially parallel to the epitaxial growth surface from the plurality of epitaxial crystal grains;
    forming the first semiconductor layer by growing the epitaxial film along the direction substantially perpendicular to the epitaxial growth surface.

10. The method of claim 1, wherein the first semiconductor layer is grown via a heteroepitaxial growth method.

11. The method of claim 1, further comprising a step of forming a plurality of microstructures on the second semiconductor layer before applying the upper electrode.

12. The method of claim 11, wherein the plurality of microstructures is formed by:
    placing a second carbon nanotube layer on a surface of the second semiconductor layer; and
    growing the plurality of the microstructures on the second semiconductor layer via epitaxial growth.

13. The method of claim 11, further comprising removing the second carbon nanotube layer after growing the microstructures.

14. The method of claim 1, wherein the carbon nanotube layer is peeled off with the substrate together in the step of removing the substrate, and a plurality of grooves is formed on a surface of the first semiconductor layer away from the active layer.

15. A method of fabricating a light emitting diode, the method comprising:
    providing a substrate having an epitaxial growth surface;
    growing a buffer layer on the epitaxial growth surface;
    applying a first carbon nanotube layer on the buffer layer;
    growing a first semiconductor layer, an active layer, and a second semiconductor layer in that order on the substrate, wherein the first semiconductor layer covers on the carbon nanotube layer;
    applying an upper electrode on a surface of the second semiconductor layer;
    removing the substrate and the buffer layer to expose the carbon nanotube layer; and
    applying a lower electrode on the first semiconductor layer.

16. The method of claim 15, wherein the lower electrode is electrically connected with the first carbon nanotube layer.

17. The method of claim 14, further comprising a step of forming a plurality of microstructures on the second semiconductor layer before the step of forming the upper electrode.

18. A method of fabricating the light emitting diode, comprising:
provviding a substrate having an epitaxial growth surface;
placing a first carbon nanotube layer on the epitaxial growth surface;
growing a first semiconductor layer, an active layer, and a second semiconductor layer in that order on the substrate, the first semiconductor layer covers on the carbon nanotube layer;
forming a plurality of the microstructures on the second semiconductor layer via epitaxial growth;
applying an upper electrode on a surface of the second semiconductor layer;
removing the substrate; and
applying a lower electrode to electrically connect with the carbon nanotube layer.

19. The method of claim 18, further comprising growing a buffer layer and an intrinsic semiconductor layer in that order on the epitaxial growth surface before growing the first semiconductor layer.

20. The method of claim 18, wherein the microstructures on the second semiconductor layer are formed by:
placing a second carbon nanotube layer on a surface of the second semiconductor layer, wherein the second carbon nanotube layer defines a plurality of apertures;
growing a third semiconductor layer on the second semiconductor layer in the apertures of carbon nanotube layer; and
removing the second carbon nanotube layer.

* * * * *